United States Patent
Li et al.

(12) 
(10) Patent No.: US 6,323,101 B1
(45) Date of Patent: Nov. 27, 2001

(54) SEMICONDUCTOR PROCESSING METHODS, METHODS OF FORMING SILICON DIOXIDE METHODS OF FORMING TRENCH ISOLATION REGIONS, AND METHODS OF FORMING INTERLEVEL DIELECTRIC LAYERS

(75) Inventors: Weimin Li; Trung Tri Doan, both of Boise, ID (US); David L. Chapek, Merrimack, NH (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/146,843

(22) Filed: Sep. 3, 1998

(51) Int. Cl.[7] .................................................. H01L 21/76

(52) U.S. Cl. .................... 438/404; 438/431; 438/618; 438/642; 438/787

(58) Field of Search ................................... 438/404, 431, 438/618, 642, 787

(56) References Cited

U.S. PATENT DOCUMENTS

| | | |
|---|---|---|
| 4,502,914 | 3/1985 | Trumpp . |
| 5,217,926 | 6/1993 | Langley . |
| 5,219,613 * | 6/1993 | Fabry et al. . |
| 5,270,267 * | 12/1993 | Ouellet . |
| 5,429,995 | 7/1995 | Nishiyama et al. . |
| 5,541,445 * | 7/1996 | Ouellet . |
| 5,702,976 | 12/1997 | Schuegraf et al. . |
| 5,786,039 | 7/1998 | Brouquet .............................. 427/578 |
| 5,800,877 | 9/1998 | Maeda et al. ........................ 427/535 |
| 5,858,880 * | 1/1999 | Dobson et al. . |
| 5,874,367 * | 2/1999 | Dobson . |

OTHER PUBLICATIONS

Ralls, Kenneth et al., Introduction to Materials Science and Engineering, John Wiley & Sons, pp. 312–314, 1976.*

P. Singer, "new Interconnect Materials: Chasing the Promise of Faster Chips", Semiconductor International, Nov. 1994, pp. 52–56.

S. McClatchie, K. Beekman, A. Diermasz, C. Dobson, "300 mm arriving fast", Abstract from European Semiconductor vol. 17, No. 8, Nov. 1995.

(List continued on next page.)

Primary Examiner—Richard Booth
Assistant Examiner—Josetta I. Jones
(74) Attorney, Agent, or Firm—Knobbe, Martens, Olson & Bear LLP

(57) ABSTRACT

In one aspect, the invention includes a semiconductor processing method of removing water from a material comprising silicon, oxygen and hydrogen, the method comprising maintaining the material at a temperature of at least about 100° C., more preferably at least 300° C., and at a pressure of greater than 1 atmosphere to drive water from the material. In another aspect, the invention includes a semiconductor processing method of forming $SiO_2$ having a wet etch removal rate of less than about 700 Angstroms/minute comprising: a) forming a layer comprising $Si(OH)_x$; b) maintaining the $Si(OH)_x$ at a temperature of at least about 300° C. and at a pressure of greater than 1 atmosphere to drive water from the $Si(OH)_x$; and c) converting the $Si(OH)_x$ to $SiO_2$, the $SiO_2$ having a wet etch removal rate of less than about 700 Angstroms/minute under the conditions of a buffered oxide etch utilizing 20:1 $H_2O$:HF, at about atmospheric pressure and at a temperature of about 30° C. In another aspect, the invention includes a method of forming a trench isolation region comprising: a) forming a trench within a substrate; b) forming a layer comprising $Si(OH)_x$ within the trench and over the substrate; c) driving water from the layer comprising $Si(OH)_x$ at a pressure of greater than 1 atmosphere; d) converting the $Si(OH)_x$ to $SiO_2$; and e) removing at least a portion of the $SiO_2$.

46 Claims, 2 Drawing Sheets

OTHER PUBLICATIONS

Joubert, et al., "Plasma polymerized all–dry resist process for 0.25 µm photolithography", J. Vac. Sci. Technol. B., vol. 12, No. 6, pp. 3909–3913, Nov./Dec. 1994.

"Silanol Terminated and Related Polydimethylsiloxanes", United Chemical Technologies, Inc. http://www.unitedchem.com/silanol.html, last updated Aug. 11, 1998.

"Silane Coupling Agent Chemistry", United Chemical Technologies, Inc., http://www.unitedchem.com/coupling.html, last updated Aug. 11, 1998.

"Parylene Conformal Coatings", Para Tech Coating, Inc. ©1996.

S. McClatchie et al.; "Low Dielectric Constant Flowfill® Technology For IMD Applications"; undated; 7 pages.

A. Kiermasz et al.; "Planarisation for Sub–Micron Devices Utilising a New Chemistry"; Feb. 1995; 2 pages.

K. Beekmann et al.; "Sub–micron Gap Fill and In–Situ Planarisation using Flowfill$^{SM}$ Technology"; Oct. 1995; pp. 1–7.

* cited by examiner

SEMICONDUCTOR PROCESSING METHODS, METHODS OF FORMING SILICON DIOXIDE METHODS OF FORMING TRENCH ISOLATION REGIONS, AND METHODS OF FORMING INTERLEVEL DIELECTRIC LAYERS

TECHNICAL FIELD

The invention pertains to semiconductor processing methods of forming and utilizing silicon dioxide.

BACKGROUND OF THE INVENTION

In methods of forming integrated circuits, it is frequently desired to electrically isolate components of the integrated circuits from one another with an insulative material. For example, conductive layers can be electrically isolated from one another by separating them with an insulative material. Also, devices which extend into a semiconductive substrate can be electrically isolated from one another by insulative materials formed within the substrate and between the components, such as, for example, a trench isolation region.

A suitable insulative material for isolating components of integrated circuits is silicon dioxide, which has a dielectric constant of about 4. In some applications it is desired to lower the dielectric constant of a silicon dioxide containing material to reduce parasitic capacitance. A method of lowering a dielectric constant of a silicon dioxide material is to provide dopant atoms within the material. An example dopant atom is carbon.

A recently developed technique for forming silicon dioxide is a Flowfill™ technology, which has been developed by Trikon Technology of Bristol, U.K. In such process, $SiH_4$ and $H_2O_2$ are separately introduced into a chemical vapor deposition (CVD) chamber, such as a parallel plate reaction chamber. The reaction rate between $SiH_4$ and $H_2O_2$ can be moderated by the introduction of nitrogen into the reaction chamber. A wafer is provided s within the chamber, and ideally maintained at a suitably low temperature, such as 0° C., at an exemplary pressure of 1 Torr to achieve formation of a silanol-type structure of the formula $Si(OH)_x$, which is predominately $Si(OH)_4$. The $Si(OH)_4$ condenses onto the wafer surface. Although the reaction occurs in the gas phase, the deposited $Si(OH)_4$ is in the form of a very viscous liquid which flows to fill very small gaps on the wafer surface. In applications where deposition thickness increases, surface tension drives the deposited layer flat, thus forming a planarized layer over the substrate.

The liquid $Si(OH)_4$ is typically converted to a silicon dioxide structure by a two-step process. First, planarization of the liquid film is promoted by increasing the temperature to about 100° C., while maintaining the pressure of about 1 Torr, to result in solidification and formation of a polymer layer. Thereafter, the temperature is raised to approximately 450° C., while maintaining the pressure of about 1 Torr, to form $SiO_2$. The processing at 450° C. also provides the advantage of driving undesired water from the resultant $SiO_2$ layer. Unfortunately, $SiO_2$ formed according to the above-described method is typically less dense than $SiO_2$ formed by other methods, and will have an unacceptably, and frequently unpredictably, fast etch rate. Also, the low density of the $SiO_2$ layer can adversely affect a dielectric constant of the layer.

It would be desirable to develop alternative methods of forming $SiO_2$ which alleviate one or more of the above-described problems.

SUMMARY OF THE INVENTION

In one aspect, the invention includes a semiconductor processing method of removing water from a material comprising silicon, oxygen and hydrogen. The method comprises maintaining the material at a temperature of at least about 100° C., more preferably at least 300° C., and at a pressure of greater than 1 atmosphere.

In another aspect, the invention includes a semiconductor processing method of forming $SiO_2$ having a wet etch removal rate of less than about 700 Angstroms/minute. A layer comprising $Si(OH)_x$ is formed. The $Si(OH)_x$ is maintained at a temperature of at least about 100° C., more preferably at least 300° C., and at a pressure of greater than 1 atmosphere to drive water from the $Si(OH)_x$. The $Si(OH)_x$ is converted to $SiO_2$. The $SiO_2$ has a wet etch removal rate of less than about 700 Angstroms/minute under the conditions of a buffered oxide etch utilizing 20:1 $H_2O:HF$, at about atmospheric pressure and at a temperature of about 30° C.

In yet another aspect, the invention includes a method of forming a trench isolation region. A trench is formed within a substrate. A layer comprising $Si(OH)_x$ is formed within the trench and over the substrate. Water is driven from the layer comprising $Si(OH)_x$ at a pressure of greater than 1 atmosphere. The $Si(OH)_x$ is converted to $SiO_2$. At least a portion of the $SiO_2$ is removed with a wet etch.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

The invention generally encompasses methods of forming silicon dioxide from an $Si(OH)_x$ material (e.g., $Si(OH)_4$) by processing the $Si(OH)_x$ material at pressures in excess of 1 atmosphere, preferably in excess of 2 atmospheres, more preferably in excess of 5 atmospheres, and even more preferably of at least about 10 atmospheres, to drive water from the $Si(OH)_x$ material. Processing of the present invention preferably further comprises temperatures of at least about 100° C., more preferably of at least about 300° C., and even more preferably of 400° C. or above. An example processing method of the present invention will subject a layer comprising $Si(OH)_x$ to a pressure of at least about 10 atmospheres and a temperature of at least about 400° C. for is a time of at least about 30 minutes to drive water from the $Si(OH)_x$. The $Si(OH)_x$ is then converted to $SiO_2$. Processing at the high temperatures of the present invention is determined to increase a density of the formed $SiO_2$ relative to a density which would occur if the $Si(OH)_x$ were processed according to the lower-pressure prior art methods described in the "Background" section of this disclosure.

Also in accordance with the present invention, it is recognized that surface defects can occur in a layer of $SiO_2$ formed by the lower-pressure prior art methods described in the "Background" section of this disclosure, and that such surface defects can be alleviated with higher-pressure processing. For instance, the lower-pressure processing of $Si(OH)_x$ can form water vapor "bubbles" that only partially escape from the $Si(OH)_x$. The water vapor bubbles thus leave pits or pores in an $SiO_2$ material formed from the $Si(OH)_x$ layer.

Figure 1:
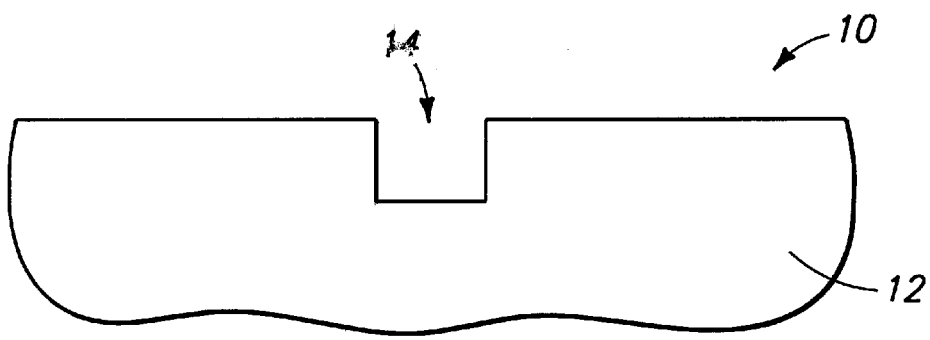
FIG. 1 is a diagrammatic, fragmentary, cross-sectional view of a semiconductor wafer fragment at a preliminary processing step of a first embodiment process of the present invention.

A first embodiment process of the present invention is described with reference to FIGS. 1–3. The first embodiment process is a method of forming a trench isolation region within a substrate. Referring to FIG. 1, a semiconductor wafer fragment 10 is illustrated. Wafer fragment 10 comprises a substrate 12 having a trench 14 formed therein. Substrate 12 can comprise, for example, a monocrystalline silicon wafer lightly doped with a p-type conductivity enhancing dopant. To aid in interpretation of the claims that follow, the term "semiconductive substrate" is defined to mean any construction comprising semiconductive material, including, but not limited to, is bulk semiconductive materials such as a semiconductive wafer (either alone or in assemblies comprising other materials thereon), and semiconductive materials (either alone or in assemblies comprising other materials). The term "substrate" refers to any supporting structure, including, but not limited to, the semiconductive substrates described above.

Figure 2:
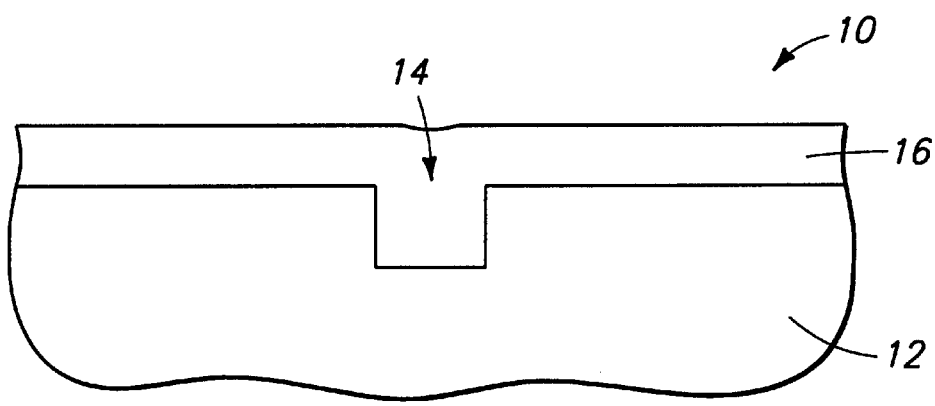
FIG. 2 is a view of the FIG. 1 wafer fragment at a processing step subsequent to that of FIG. 1.

Referring to FIG. 2, a layer 16 is formed over substrate 12 and within trench 14. Layer 16 comprises $Si(OH)_x$, and can be formed, for example, by reaction of $SiH_4$ and $H_2O_2$ in the process described in the "Background" section of this disclosure.

Layer 16 is preferably exposed to a pressure of at least about 10 atmospheres and a temperature of at least about 300° C. to drive water from the layer. The $Si(OH)_x$ is then converted to $SiO_2$. Preferably, substantially all (i.e., greater than about 90%) of the water is driven from the $Si(OH)_x$, and more preferably all the water is driven from the $Si(OH)_x$. It has been determined that temperatures significantly above 300° C. are most suited for removing water from $Si(OH)_x$ within a trench. Accordingly, layer 16 is preferably exposed to temperatures of at least about 900° C., and more preferably of from about 900° C. to about 1000° C. to drive water from within the layer.

Pressures of at least about 10 atmospheres are preferred for the present invention, and an upper limit of the pressure is generally not important to methods of the present invention. A cap on the upper limit of the pressure can be, however, imposed by the structural integrity of wafer fragment 10. Generally, if wafer fragment 10 comprises monocrystalline silicon, pressures should not exceed 25 atmospheres to avoid cracking the wafer fragment.

A time for which layer 16 is exposed to pressure and temperature conditions of the present invention can vary depending on the thickness of layer 16 and on whether water is to be substantially entirely removed (i.e., greater than 90% of the water removed) or entirely removed from the layer. Thicker layers generally require longer treatment times than thinner layers, and it takes longer to entirely remove water from a layer than to substantially entirely remove water from the layer. It has been found that times of at least about 30 minutes are generally sufficient to drive substantially all of the water from an $Si(OH)_x$ layer 16 having a thickness of about from about 8000 Angstroms to about 9000 Angstroms within trench 14.

While $Si(OH)_x$ layer 16 is exposed to the pressure and temperature conditions of the present invention, the layer is preferably also exposed to an ambient consisting essentially of one or more gasses selected from the group consisting of $N_2$, Ar, $N_2O$, $O_2$ and $O_3$. Such gasses advantageously are either non-reactive with $SiO_2$ formed from the $Si(OH)_x$, or will react only to add oxygen to the $SiO_2$. Addition of oxygen to such layers will generally not adversely affect a dielectric constant of the layers.

Figure 3:
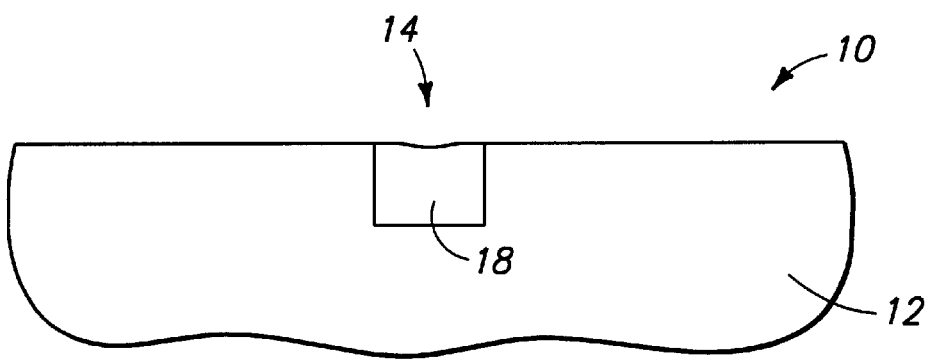
FIG. 3 is a view of the FIG. 1 wafer fragment at a processing step subsequent to that shown in FIG. 2.

Referring to FIG. 3, layer 16 (shown in FIG. 3) is chemically-mechanically polished to remove the layer from above substrate 12 and to leave an insulative plug 18 within trench 14. To ensure the structural and electrical integrity of the device, it is preferred that the wet etch rate of $SiO_2$ be as close to thermal oxide as possible. The etch of layer 16 can comprise, for example, a wet etch. An example wet etch is a buffered oxide etch utilizing $H_2O:HF$ (20:1, by weight). An $SiO_2$ layer 16 will etch at a rate of less than or equal to about 500 Angstroms/minute with such buffered oxide etch. In contrast, a prior art $SiO_2$ layer formed by the processing described in the "Background" of this disclosure will etch at a rate of about 730 Angstroms/minute with the buffered oxide etch. Accordingly, the $SiO_2$ of the present invention is substantially denser than such prior art $SiO_2$.

An alternative etch method for etching the $SiO_2$ of layer 16 is a wet etch utilizing tetramethyl ammonium hydroxide (TMAH). Under identical etch conditions, an $SiO_2$ layer formed by methods of the present invention will etch at a rate of less than or equal to 30 Angstroms/minute (an example is 28.7 Angstroms/minute), while an $SiO_2$ layer formed by the methods described in the "Background" of this invention will etch at a rate of greater than 60 Angstroms/minute (an example is 62.8 Angstroms/minute). Accordingly, the TMAH etch also verifies that an $SiO_2$ layer formed according to a method of the present invention is substantially denser than $SiO_2$ layers formed according to the prior art methods described in the "Background" section of this disclosure.

Figure 4:
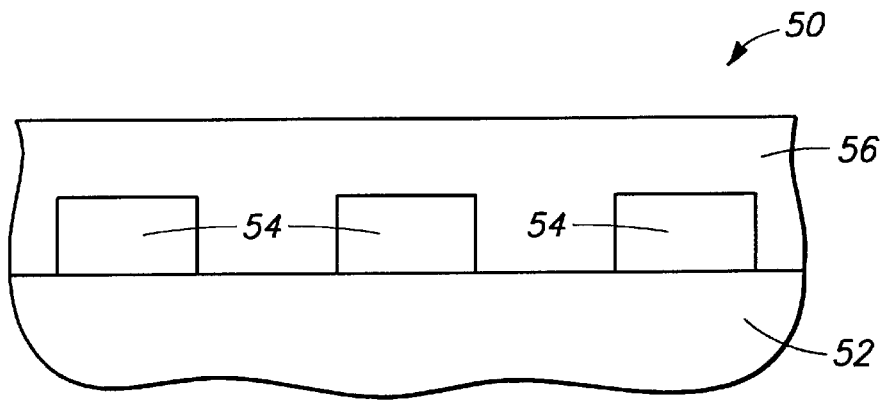
FIG. 4 is a fragmentary, diagrammatic, cross-sectional view of a semiconductor wafer fragment at a preliminary processing step according to a second embodiment method of the present invention.

A second embodiment of the present invention is described with reference to FIGS. 4–6. The second embodiment pertains to a method of forming an interlevel dielectric layer comprising $SiO_2$. Referring to FIG. 4, a semiconductor wafer fragment 50 is illustrated. Wafer fragment 50 comprises a substrate 52, and a first conductive metal layer 54 formed over substrate 52. Substrate 52 can comprise an insulative material, such as, for example, silicon dioxide, borophosphosilicate glass (BPSG), or silicon nitride. Substrate 52 can be formed over a monocrystalline silicon wafer (not shown). Metal layer 54 can comprise, for example, aluminum, or an aluminum alloy, and can be formed by conventional methods, such as, for example, sputter deposition.

A dielectric layer 56 is formed over first metal layer 54. In accordance with the present invention, layer 56 is formed by depositing a layer comprising $Si(OH)_x$, and processing the layer to drive water from the $Si(OH)_x$. The $Si(OH)_x$ is then converted to $SiO_2$. The $Si(OH)_x$ can be deposited utilizing $SiH_4$ and $H_2O_2$ in accordance with the process described in the "Background" section of this disclosure, and can be formed to a thickness of about 5000 Angstroms to about 8000 Angstroms. The water is removed by subjecting the $Si(OH)_x$ to a pressure of at least about 10 atmospheres and a temperature of at least about 300° C. Preferably, the temperature is less than or equal to 500° C., to avoid inadvertently melting first metal layer 54. Also, the pressure is preferably no greater than about 25 atmospheres to avoid cracking a material of semiconductor wafer fragment 50. The $Si(OH)_x$ material can be processed at the above-described pressures and temperatures for a time of at least about 30 minutes to drive substantially all of the water from the material. Also, the $Si(OH)_x$ is preferably exposed to an ambient consisting essentially of one or more gasses selected from the group consisting of $N_2$, Ar, $N_2O$, $O_2$ and $O_3$ as the material is converted to $SiO_2$, for reasons discussed above with reference to FIG. 2.

Figure 5:
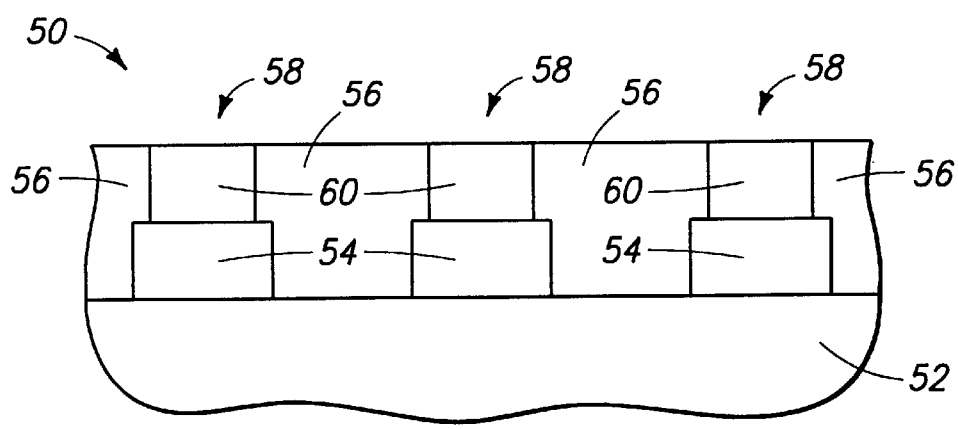
FIG. 5 is a view of the FIG. 4 wafer fragment shown at a processing step subsequent to that of FIG. 4.

Referring to FIG. 5, portions of $SiO_2$ layer 56 are removed to form openings 58 extending through layer 56 and to first metal layer 54. Openings 58 can be formed, for example, by providing a patterned photoresist (not shown) over layer 56 to leave portions of layer 56 exposed where openings 58 are to be formed. The exposed portions of layer 56 can then be wet etched to form openings 58. A suitable wet etching method is the buffered oxide etch described above with reference to FIG. 3. During such buffered oxide etch, silicon dioxide layer 56 will have an etch rate of less than or equal to about 500 Angstroms/minute.

After formation of openings 58, conductive plugs 60 are formed within openings 58. Conductive plugs 60 can be formed by conventional methods, such as by providing a conductive material over layer 56 and within openings 58, and subsequently planarizing the conductive material to remove it from over layer 56. Conductive plugs 60 can comprise, for example, tungsten.

Figure 6:
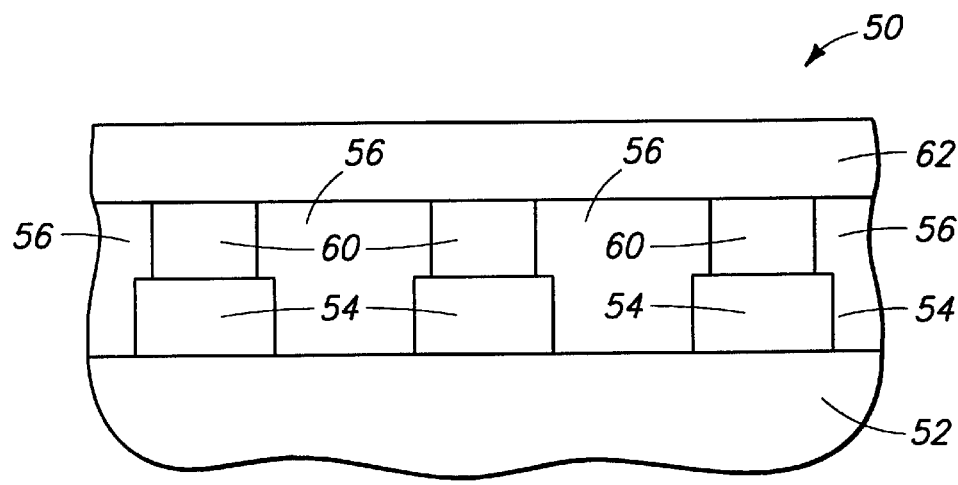
FIG. 6 is a view of the FIG. 4. wafer fragment shown at a processing step subsequent to that of FIG. 5.

Referring to FIG. 6, a second metal layer 62 is formed over dielectric layer 56 and in electrical contact with conductive plugs 60. Second metal layer 62 can comprise, for example, aluminum, or an aluminum alloy, and can ii be formed, for example, by sputter deposition.

It is to be understood that the embodiment of FIGS. 4–6 is but one embodiment of the present invention for forming a dielectric layer between conductive materials. The invention encompasses many other embodiments which are not specifically shown. For instance, in addition to the shown embodiment of forming an interlevel dielectric layer vertically between conductive electrical components, the invention encompasses embodiments in which a dielectric layer is formed horizontally between conductive electrical components.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A semiconductor processing method of removing water from a material comprising silicon, oxygen and hydrogen, the method comprising maintaining the material at a temperature of greater than about 100° C. and applying a pressure of greater than 1 atmosphere to drive water from the material.

2. The method of claim 1 wherein the temperature is at least about 300° C.

3. The method of claim 1 wherein the pressure is at least about 2 atmospheres.

4. The method of claim 1 wherein the pressure is at least about 5 atmospheres.

5. The method of claim 1 wherein the pressure is greater than 10 atmospheres.

6. The method of claim 1 wherein the temperature and pressure are maintained for at least about 30 minutes.

7. The method of claim 1 wherein the material comprises $Si(OH)_x$.

8. A semiconductor processing method of removing water from a material comprising silicon, oxygen and hydrogen, the method comprising maintaining the material at a temperature of greater than about 100° C. and at a pressure of greater than 1 atmosphere to drive water from the material, wherein the material comprises $Si(OH)_x$ and a dopant within the $Si(OH)_x$.

9. The method of claim 8 wherein the material comprises a mixture of $Si(OH)_x$ and carbon.

10. A semiconductor Processing method of removing water from a material comprising silicon, oxygen and hydrogen, the method comprising maintaining the material at a temperature of greater than about 100° C. and at a pressure of greater than 1 atmosphere to drive water from the material. wherein the temperature is at least about 500° C.

11. The method of claim 10 wherein the temperature is at least about 900° C.

12. The method of claim 8 wherein the pressure is less than about 25 atmospheres.

13. The method of claim 1 wherein the material is exposed to an ambient consisting essentially of one or more gases selected from group consisting of $N_2$, Ar, $N_2O$, $O_2$ and $O_3$ as the pressure and temperature are maintained.

14. A semiconductor processing method of forming $SiO_2$ having a wet etch removal rate of less than about 700 Angstroms/minute comprising:

forming a layer comprising $Si(OH)_x$;

maintaining the $Si(OH)_x$ at a temperature of at least about 300° C. and at a pressure of greater than 1 atmosphere to drive water from the $Si(OH)_x$; and converting the $Si(OH)_x$ to $SiO_2$, the $SiO_2$ having a wet etch removal rate of less than about 700 Angstroms/minute under the conditions of a buffered oxide etch utilizing 20:1 $H_2O$:HF, at about atmospheric pressure and at a temperature of about 30° C.

15. The method of claim 14 wherein the pressure is at least about 2 atmospheres.

16. The method of claim 14 wherein the pressure is at least about 5 atmospheres.

17. The method of claim 14 wherein the pressure is greater than 10 atmospheres.

18. The method of claim 14 wherein the wet etch removal rate is less than or equal to about 500 Angstroms/minute.

19. The method of claim 14 wherein the layer comprising $Si(OH)_x$ is formed by combining silane with hydrogen peroxide.

20. The method of claim 14 wherein temperature is at least about 500° C.

21. The method of claim 14 wherein the temperature is at least about 900° C.

22. The method of claim 14 wherein the pressure is less than about 25 atmospheres.

23. The method of claim 14 wherein the temperature and pressure are maintained for at least about 30 minutes.

24. The method of claim 14 wherein the material is exposed to an ambient consisting essentially of one or more gases selected from group consisting of $N_2$, Ar, $N_2O$, $O_2$ and $O_3$ as the pressure and temperature are maintained.

25. A method of forming a trench isolation region comprising:
   forming a trench within a substrate;
   forming a layer comprising $Si(OH)_x$ within the trench and over the substrate;
   driving water from the layer comprising $Si(OH)_x$ at a pressure of greater than 1 atmosphere; and
   converting the $Si(OH)_x$ to $SiO_2$.

26. The method of claim 25 wherein the pressure is at least about 2 atmospheres.

27. The method of claim 25 wherein the pressure is at least about 5 atmospheres.

28. The method of claim 25 wherein the pressure is at least 10 atmospheres.

29. The method of claim 25 wherein the driving water comprises a temperature of at least about 900° C.

30. The method of claim 25 wherein the driving water comprises a temperature of from about 900° C. to about 1000° C.

31. The method of claim 25 wherein the pressure is maintained for at least about 30 minutes.

32. The method of claim 25 further comprising removing at least a portion of the $SiO_2$ with a wet etch comprising a buffered oxide etch utilizing 20:1 $H_2O$:HF at about atmospheric pressure and at a temperature of about 30° C., the etching comprising a rate of removal of $SiO_2$ of less than or equal to about 500 Angstroms/minute.

33. A method of forming an interlevel dielectric layer comprising:
   forming a first conductive layer and a second conductive layer;
   forming a layer comprising $Si(OH)_x$;
   driving water from the layer of $Si(OH)_x$ at a temperature of less than or equal to about 500° C. and a pressure of greater than 1 atmosphere;
   converting the layer of $Si(OH)_x$ to $SiO_2$; and
   providing the $SiO_2$ between the first and second conductive layers to electrically separate the first and second conductive layers.

34. The method of claim 33 wherein the pressure is at least about 2 atmospheres.

35. The method of claim 33 wherein the pressure is at least about 5 atmospheres.

36. The method of claim 33 wherein the pressure is at least 10 atmospheres.

37. The method of claim 33 wherein at least one of the first and second conductive layers is formed before the layer comprising $Si(OH)_x$ is formed.

38. The method of claim 33 wherein at least one of the first and second conductive layers is formed after the layer comprising $Si(OH)_x$ is formed.

39. The method of claim 33 wherein the driving water from the $Si(OH)_x$ occurs before at least one of the first and second conductive layers is formed.

40. The method of claim 33 wherein the driving water from the $Si(OH)_x$ occurs after at least one of the first and second conductive layers is formed.

41. The method of claim 33 wherein the first conductive layer is formed below the layer comprising $Si(OH)_x$ and the second conductive layer is formed over the $SiO_2$.

42. The method of claim 33 wherein the temperature and pressure are maintained for at least about 30 minutes.

43. The method of claim 33 further comprising removing at least a portion of the layer of the $SiO_2$.

44. The method of claim 43 wherein the removing at least a portion of the layer of the $SiO_2$ occurs before at least one of the first and second conductive layers is formed.

45. The method of claim 43 wherein the removing at least a portion of the layer of the $SiO_2$ occurs after at least one of the first and second conductive layers is formed.

46. The method of claim 43 wherein the removing comprises a wet etch comprising a buffered oxide etch utilizing 20:1 $H_2O$:HF at about atmospheric pressure and at a temperature of about 30° C., the wet etching comprising a rate of removal of $SiO_2$ of less than or equal to about 500 Angstroms/minute.

* * * * *